(12) United States Patent
Jin (10) Patent No.: US 12,490,594 B2
(45) Date of Patent: Dec. 2, 2025

(54) DISPLAY PANEL AND DISPLAY DEVICE

(71) Applicant: WUHAN TIANMA MICROELECTRONICS CO., LTD., Wuhan (CN)

(72) Inventor: Chunming Jin, Wuhan (CN)

(73) Assignee: WUHAN TIANMA MICROELECTRONICS CO., LTD., Wuhan (CN)

( * ) Notice: Subject to any disclaimer, the term of this patent is extended or adjusted under 35 U.S.C. 154(b) by 633 days.

(21) Appl. No.: 17/857,348

(22) Filed: Jul. 5, 2022

(65) Prior Publication Data

US 2022/0336568 A1    Oct. 20, 2022

(30) Foreign Application Priority Data

Apr. 2, 2022   (CN) ......................... 202210351660.9

(51) Int. Cl.
*H10K 59/122*   (2023.01)
*H10K 59/131*   (2023.01)
*H10K 59/65*    (2023.01)
*H10K 59/80*    (2023.01)

(52) U.S. Cl.
CPC ......... *H10K 59/122* (2023.02); *H10K 59/131* (2023.02); *H10K 59/65* (2023.02); *H10K 59/873* (2023.02)

(58) Field of Classification Search
None
See application file for complete search history.

(56) References Cited

U.S. PATENT DOCUMENTS

| | | | | |
|---|---|---|---|---|
| 11,844,239 | B2 * | 12/2023 | Qin ..................... | H10K 59/873 |
| 2020/0027936 | A1 * | 1/2020 | Wang .................... | G03F 7/094 |
| 2021/0257434 | A1 * | 8/2021 | Xie ........................ | H10K 71/00 |
| 2022/0344421 | A1 * | 10/2022 | Huang ................. | H10K 59/124 |

FOREIGN PATENT DOCUMENTS

| | | | |
|---|---|---|---|
| CN | 109802052 A | 5/2019 | |
| CN | 110212117 A | 9/2019 | |
| CN | 112909059 A | 6/2021 | |
| WO | WO-2020253320 A1 * | 12/2020 | ............. H10K 71/00 |

OTHER PUBLICATIONS

First Chinese Office Action mailed on Mar. 19, 2025, issued in Chinese App. No. 202210351660.9; 13 pages.

* cited by examiner

*Primary Examiner* — Dale E Page
*Assistant Examiner* — Rohit Parthasarathy
(74) *Attorney, Agent, or Firm* — CHRISTENSEN O'CONNOR JOHNSON KINDNESS PLLC (57) ABSTRACT

A display panel and a display device are provided. In an embodiment, the display panel includes a substrate; an isolating pillar; and a light-emitting functional layer. In an embodiment, the display panel has a display region, a first non-display region and a through-hole region. In an embodiment, the isolating pillar includes at least one isolating group, each of which includes a first sub-portion, and a second sub-portion. In an embodiment, the first sub-portion includes a middle portion and two end portions. In an embodiment, a cushion layer structure is disposed between the end portion and the second sub-portion, and an edge of the end portions extends beyond the cushion layer structure in the first direction to form a respective step.

17 Claims, 6 Drawing Sheets

DISPLAY PANEL AND DISPLAY DEVICE

CROSS-REFERENCE TO RELATED APPLICATION

The present application claims priority to Chinese Patent Application No. 202210351660.9, filed on Apr. 2, 2022, the content of which is incorporated herein by reference in its entirety.

TECHNICAL FIELD

The present disclosure relates to the field of display technologies, and, particularly, relates to a display panel and a display device.

BACKGROUND

Conventionally, a through-hole, where sensing devices such as cameras are provided, is provided within a display region of a display panel, so that these devices do not occupy a space of a frame region of the display panel, thereby reducing a width of the frame. For an organic, self-luminous display panel, after the through-hole is formed within the display region, a light-emitting functional layer exposed at an edge of a sidewall of the through-hole may form a channel that allows the passage of water and oxygen, thereby affecting performance reliability of the display panel.

SUMMARY

In a first aspect of the present disclosure, a display panel is provided. In an embodiment, the display panel includes: a substrate; an isolating pillar; and a light-emitting functional layer. In an embodiment, the display panel has a display region, a first non-display region and a through-hole region, the display region at least partially surrounds the through-hole region, and the first non-display region is located between the display region and the through-hole region. In an embodiment, the isolating pillar and the light-emitting functional layer are located at a same side of the substrate; the isolating pillar is located in the first non-display region, and the light-emitting functional layer extends from the display region to the first non-display region. In an embodiment, the isolating pillar includes at least one isolating group, and each group of the at least one isolating group includes a first sub-portion, and a second sub-portion located at a side of the first sub-portion close to the substrate. In an embodiment, the first sub-portion includes a middle portion and two end portions, the middle portion is located between the two end portions in a first direction, the middle portion is in contact with the second sub-portion, and the two end portions are connected to the middle portion. In an embodiment, a cushion layer structure is disposed between the second sub-portion and each of the two end portions, and an edge of each of the two end portions extends beyond the cushion layer structure in the first direction to form a respective step. In an embodiment, the light-emitting functional layer is located at a side of the isolating pillar away from the substrate, and is cut off at a position of the edge of each of the two end portions away from the middle portion.

In a second aspect of the present disclosure, a display device including a display panel is provided. In an embodiment, the display panel includes: a substrate; an isolating pillar; and a light-emitting functional layer. In an embodiment, the display panel has a display region, a first non-display region and a through-hole region, the display region at least partially surrounds the through-hole region, and the first non-display region is located between the display region and the through-hole region. In an embodiment, the isolating pillar and the light-emitting functional layer are located at a same side of the substrate; the isolating pillar is located in the first non-display region, and the light-emitting functional layer extends from the display region to the first non-display region. In an embodiment, the isolating pillar includes at least one isolating group, and each group of the at least one isolating group includes a first sub-portion, and a second sub-portion located at a side of the first sub-portion close to the substrate. In an embodiment, the first sub-portion includes a middle portion and two end portions, the middle portion is located between the two end portions in a first direction, the middle portion is in contact with the second sub-portion, and the two end portions are connected to the middle portion. In an embodiment, a cushion layer structure is disposed between the second sub-portion and each of the two end portions, and an edge of each of the two end portions extends beyond the cushion layer structure in the first direction to form a respective step. In an embodiment, the light-emitting functional layer is located on a side of the isolating pillar away from the substrate, and is cut off at a position of the edge of each of the two end portions away from the middle portion.

BRIEF DESCRIPTION OF DRAWINGS

In order to more clearly explain the embodiments of the present disclosure or the technical solution in the related art, the drawings to be used in the description of the embodiments or the related art will be briefly described below. The drawings in the following description are merely some embodiments of the present disclosure. For those skilled in the art, other drawings can also be obtained without creative efforts based on these drawings.

DESCRIPTION OF EMBODIMENTS

In order to better illustrate objectives, technical solutions and advantages of the present disclosure, the technical solutions in the embodiments of the present disclosure are described in detail with reference to the accompanying drawings. The described embodiments are merely part of the embodiments of the present disclosure rather than all of the embodiments. All other embodiments obtained by those skilled in the art based on the embodiments of the present disclosure without paying creative labor shall fall into the protection scope of the present disclosure.

The terms used in the embodiments of the present disclosure are merely for the purpose of describing specific embodiments, rather than limiting the present disclosure. The terms "a", "an", "the" and "said" in a singular form in the embodiments of the present disclosure and the attached claims are also intended to include plural forms thereof, unless noted otherwise.

For a display panel with a through-hole formed within a display region, it needs to separate a reserved region of the display panel to form the through-hole after all functional layers of the display panel (i.e., a pixel circuit layer, a light-emitting device layer, an encapsulation layer, and the like) are formed. Thus, the functional layers may be exposed at a sidewall of the through-hole. The light-emitting functional layer in the light-emitting device layer is sensitive to water and oxygen, and the light-emitting functional layer exposed at a sidewall of the thorough hole may form a channel in which water and oxygen are allowed to pass. As a result, when water and oxygen enter into a pixel region within the display region, the performance of the light-emitting functional layer may fail or be otherwise damaged, and the light-emitting device cannot display normally, causing the pixel to display a black spot and thus affecting performance reliability of the display panel.

In order to address these problems and related problems, an embodiment of the present disclosure provides a display panel, in which an isolating pillar is provided between the through-hole region and the display region to isolate the light-emitting functional layer, so that a channel through which water and oxygen might otherwise pass is blocked from the through-hole region to the display region, thereby improving performance reliability of the display panel.

Figure 1:
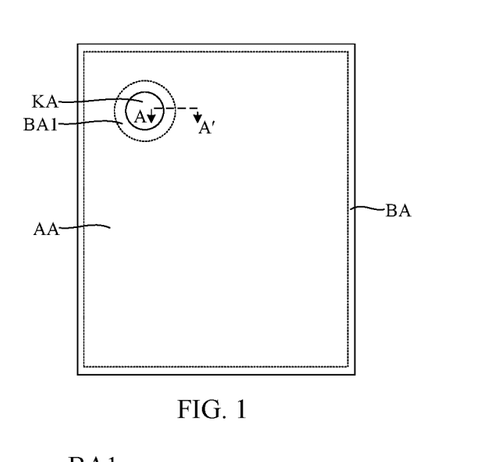
FIG. 1 is a schematic diagram of a display panel according to an embodiment of the present disclosure.
Figure 2:
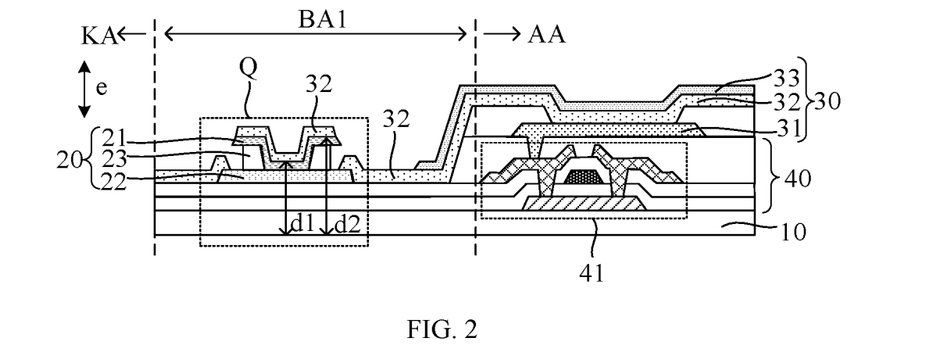
FIG. 2 is a cross-sectional view along A-A' shown in FIG. 1 according to an embodiment of the present disclosure.
Figure 3:
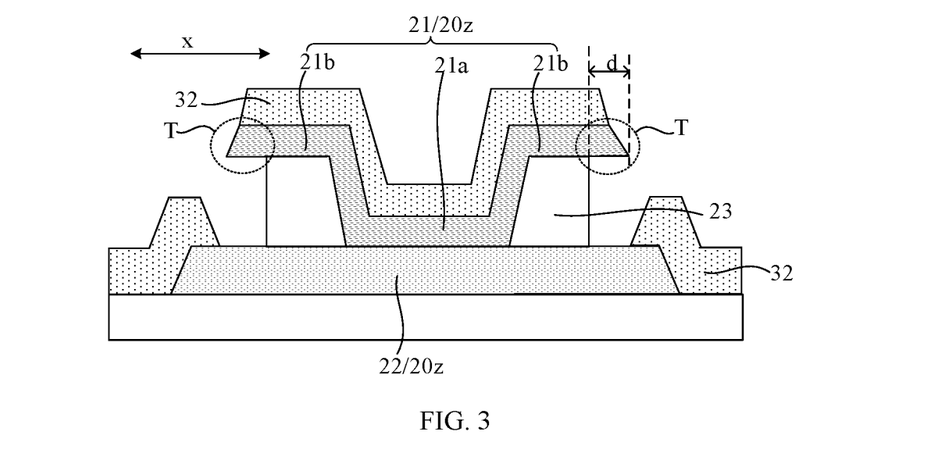
FIG. 3 is an enlarged view of a region Q shown in FIG. 2 according to an embodiment of the present disclosure.

FIG. 1 is a schematic diagram of a display panel according to an embodiment of the present disclosure, FIG. 2 is a cross-sectional view along A-A' shown in FIG. 1 according to an embodiment of the present disclosure, and FIG. 3 is an enlarged view of a region Q shown in FIG. 2 according to an embodiment of the present disclosure.

As shown in FIG. 1, the display panel includes a display region AA and a non-display region BA that surrounds the display region AA. The display panel further includes a first non-display region BA1 and a through-hole region KA. The display region AA at least partially surrounds the through-hole region KA. The first non-display region BA1 is located between the display region AA and the through-hole region KA. A location and a shape of the through-hole region KA shown in FIG. 1 are only schematic and are not limited herein by the present disclosure. The through-hole region KA is provided with a through-hole passing through at least part of layers of the display panel. When assembling the display device, an optical sensor device, such as a camera, can be provided at a position under the through-hole region KA.

As shown in FIG. 2, the display panel includes a substrate 10, and an isolating pillar 20 and a light-emitting device layer 30. The isolating pillar 20 and the light-emitting device layer 30 are located on a same side of the substrate 10. The light-emitting device layer 30 includes a first electrode 31, a light-emitting functional layer 32 and a second electrode 33. The first electrode 31 is located on a side of the light-emitting functional layer 32 close to the substrate 10. The light-emitting functional layer 32 extends from a display region AA to the first non-display region BA1. The light-emitting functional layer 32 includes at least one of an electron transporting layer, an electron injection layer, a hole transporting layer, and a hole injection layer. In some embodiments, the light-emitting device layer 30 further includes a light-emitting material layer. The first electrode 31 is a patterned block electrode, and the second electrode 33 forms a whole piece at an entire surface of the display region AA. The light-emitting device layer 30 includes a light-emitting device. The light-emitting device includes the first electrode 31, the light-emitting functional layer 32 and the second electrode 33 that are stacked.

The display panel further includes a pixel circuit layer 40 located between the substrate 10 and the light-emitting device layer 30. The pixel circuit layer 40 includes a pixel circuit 41 coupled to the first electrode 31. The pixel circuit 41 is configured to drive the light-emitting device to emit light. FIG. 2 merely schematically shows one transistor in the pixel circuit 41. An encapsulation layer (not shown in FIG. 2) is provided at a side of the light-emitting device layer 30 away from the substrate 10. The encapsulation layer is configured to isolate water and oxygen to protect the light-emitting device layer 30.

The isolating pillar 20 is located in the first non-display region BA1. The isolating pillar 20 includes at least one isolating group 20z. The isolating group 20z includes a first sub-portion 21 and a second sub-portion 22 located on a side of the first sub-portion 21 close to the substrate 10.

Referring to FIG. 3, the first sub-portion 21 includes a middle portion 21a and two end portions 21b. The middle portion 21a is located between the two end portions 21b in a first direction x. The middle portion 21a is in contact with the second sub-portion 02, and is connected to the two end portions 21b. The two end portions 21b of the first sub-portion 21 are not in direct contact with each other. The first direction x can be understood as an extending direction of A-A' shown in FIG. 1. The first direction x can also be understood as a direction from the display region AA toward the through-hole region KA. A cushion layer structure 23 is disposed between the end portion 21b and the second sub-portion 22. An edge of the end portion 21b extends beyond the cushion layer structure 23 in the first direction x to form a step T, which is marked in FIG. 3. In an embodiment, the edge of the end portion 21b in the first direction x extends beyond the cushion layer structure 23 by a length d, where 400 Å≤d≤800 Å.

The light-emitting functional layer 32 is located on a side of the isolating pillar 20 away from the substrate 10, and is cut off at a position of an edge of the end portion 21b away from the middle portion 21a. In other words, the light-emitting functional layer 32 is cut off at a position of the step T formed by the end portion 21b and the cushion layer structure 23.

For the display panel provided by the present disclosure, the isolating pillar 20 is provided in the first non-display region BA1, and includes a first sub-portion 21 and a second sub-portion 22. The middle portion 21a of the first sub-portion 21 is in contact with the second sub-portion 22. A cushion layer structure 23 is disposed between the end portion 21b of the first sub-portion 21 and the second sub-portion 22. The end portion 21b extends beyond the cushion layer structure 23 to forms the step T. In the embodiments of the present disclosure, due to the presence of the cushion layer structure 23, a certain distance is formed between the edge of the end portion 21b and a surface of the second sub-portion 22 close to the end portion 21b, so that a gap between the end portion 21b and the second sub-portion 22 separates the light-emitting functional layer 32, thereby blocking an a channel in which water and oxygen are invaded from the through-hole region KA to the display region AA, and thus improving performance reliability of the display panel.

Figure 4:
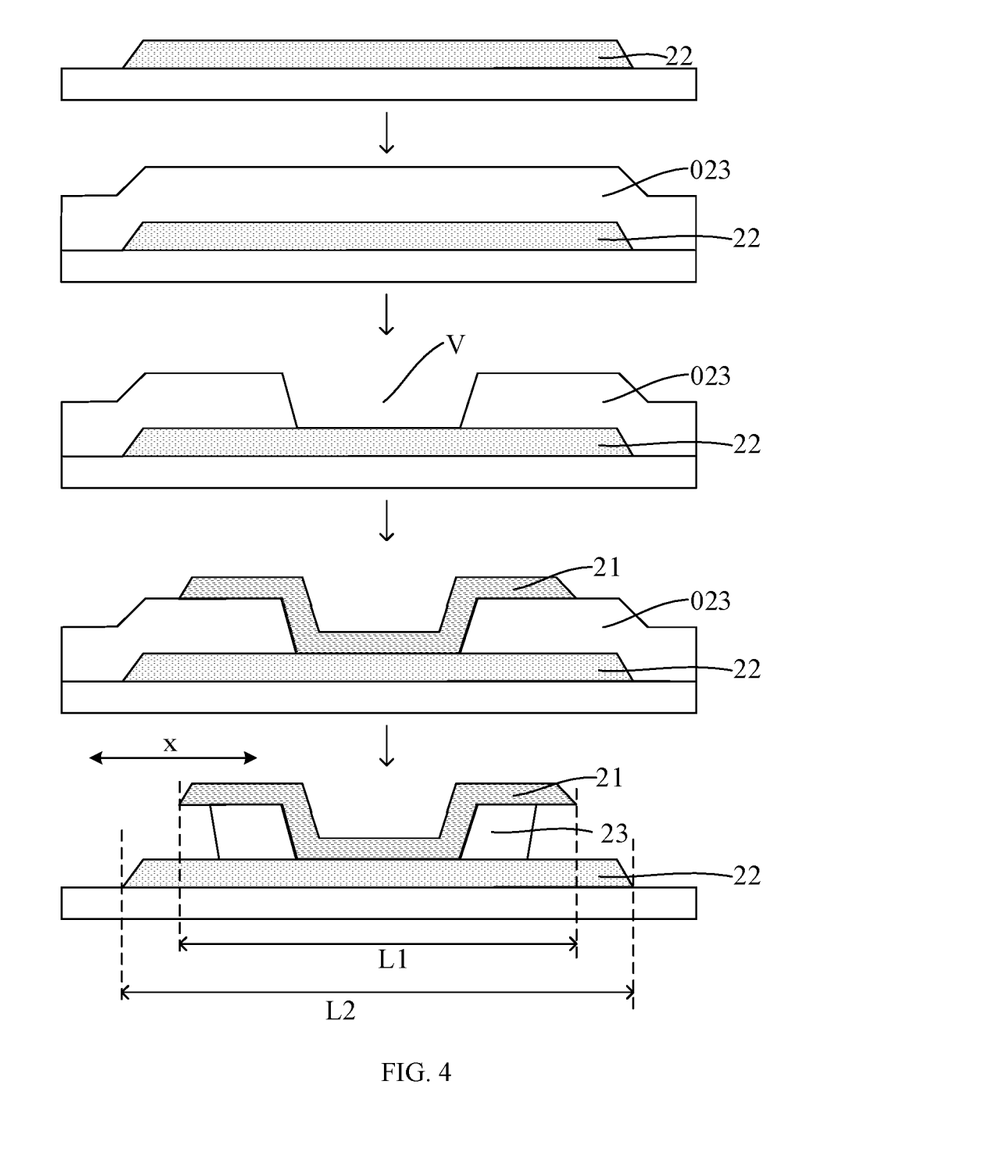
FIG. 4 is a process flow chart for a display panel according to an embodiment of the present disclosure.

In an embodiment of the present disclosure, the middle portion 21a and the end portion 21b of the first sub-portion 21 are made of a same material. The middle portion 21a and the end portion 21b are formed in a same etching process. The first sub-portion 21 is an integral structure. FIG. 4 is a process flow chart for a display panel according to an embodiment of the present disclosure. FIG. 4 illustrates a process for forming the isolating pillar 20. As shown in FIG. 4, a second sub-portion 22 is first formed by an etching process; then a cushion material layer 023 is formed on the second sub-portion 22; then the cushion material layer 023 is etched to form an aperture V; then a first sub-portion 21 is formed on the cushion material layer 023, and the first sub-portion 21 includes a middle portion 21a deposited in the aperture V to be in contact with the second sub-portion 22, and two end portions 21b extending beyond the aperture V; then the cushion material layer 023 is etched to form a cushion layer structure 23.

As shown in FIG. 2, in a direction e perpendicular to a plane of the substrate 10, a maximum distance between a surface of the middle section 21a away from the substrate 10 and the substrate 10 is defined as a first distance d1, and a maximum distance between a surface of the end portion 21b away from the substrate 10 and the substrate 10 is defined as a second distance d2. The second distance d2 is greater than the first distance d1. Taking a plane where the substrate 10 is located as a reference plane, an upper surface of the middle portion 21a is lower than an upper surface of the end portion 21b. That is, in this embodiment of the present disclosure, the end portion 21b and the middle portion 21a are not on a same horizontal plane, but the end portion 21b and the middle portion 21a of the first sub-portion 21 are formed as an integral structure. The end portion 21b and the middle portion 21a are formed in a same process. This structure is equivalent to that the first sub-portion 21 is connected to the second sub-portion 22 via a through-hole formed at the cushion layer structure 23.

In an embodiment of the present disclosure, as shown in FIG. 4, an orthographic projection of the first sub-portion 21 onto the substrate 10 is located within an orthographic projection of the second sub-portion 22 onto the substrate 10. In other words, a length L1 of the first sub-portion 21 in the first direction x is smaller than a length L2 of the second sub-portion 22 in the first direction x. With such a configuration, a certain distance is formed between the edges of the two end portions 21a of the first sub-portion 21 and a surface of the second sub-portion 22 close to the two end portions 21b, so that a gap between the edges of the two end portions 21b and the second sub-portion 22 can be used to separate the light-emitting functional layer 32. Moreover, when forming the encapsulation layer, the encapsulation layer can transition smoothly between the edge of the first sub-portion 21 and the edge of the second sub-portion 22, thereby achieving encapsulation reliability.

In an embodiment of the present disclosure, the cushion layer structure 23 includes an organic material and/or an inorganic material.

Figure 5:
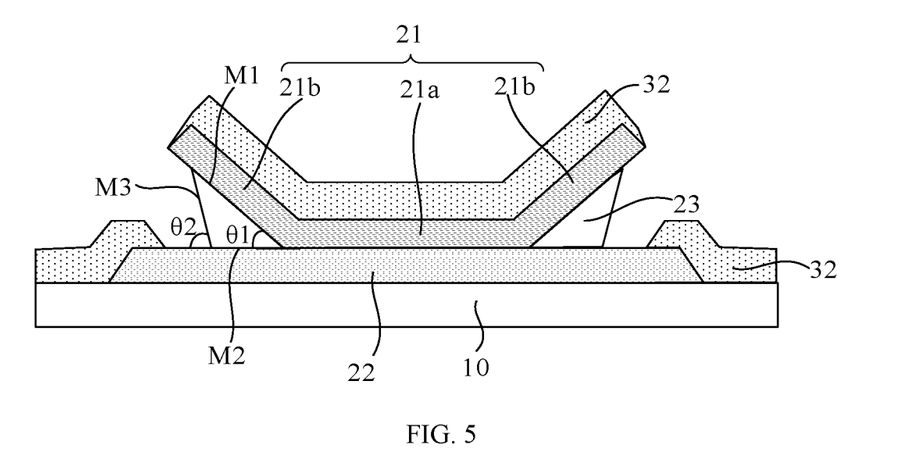
FIG. 5 is a partial schematic diagram of a display panel according to another embodiment of the present disclosure.

In an embodiment, FIG. 5 is a partial schematic diagram of a display panel according to another embodiment of the present disclosure. FIG. 5 shows the isolating pillar 20 and the light-emitting functional layer 32 located in the first non-display region BA1. As shown in FIG. 5, the cushion layer structure 23 includes an organic material. When the isolating pillar 20 is formed by using the process shown in FIG. 4, the cushion material layer 023 made of an organic material is thick, so that there is a larger distance between the edge of the end portion 21b and a surface of the second sub-portion 22 close to the end portion 21b, thereby enhancing the capability to separate the light-emitting functional layer 32 by a gap between the edge of the end portion 21b and the second sub-portion 22, thus effectively separating the light-emitting functional layer 32.

In addition, when the cushion material layer 023 is made of an organic material and etched to form an aperture V, a sidewall of the aperture V has a relatively gentle/smooth slope, and at least part of the end 21b of the first sub-portion 21 is deposited at the sidewall of the aperture V, so that an angle θ1 is formed between two surfaces of the end portion 21b and the second sub-portion 22 that are opposite to each other and are not in contact with each other, where θ1 is an acute angle. In some embodiments, 20°≤θ1≤80°. In some other embodiments, 30°≤θ1≤60°. In the present disclosure, a gap between the edge of the end portion 21b and the second sub-portion 22 can be used to separate the light-emitting functional layer 32, so that a channel in which water and oxygen are invaded from the through-hole region to the display region can be blocked, thereby improving performance reliability of the display panel.

As shown in FIG. 5, the cushion layer structure 23 includes a first surface M1, a second surface M2 and a third surface M3. The first surface M1 is in contact with the end portion 21b. The second surface M2 is in contact with the second sub-portion 22. The third surface M3 is connected between the first surface M1 and the second surface M2. An angle θ2 formed between the third surface M3 and a surface of the second sub-portion 22 and located outside the cushion layer structure 23 is an acute angle. The cushion layer structure 23 includes an organic material. The display panel provided by this embodiment of the present disclosure can adopt the process provided by the embodiments shown in FIG. 4. After the first sub-portion 21 is formed, the cushion layer material layer 023 is etched to form the cushion layer structure 23, so that the angle θ2 of the cushion layer structure 23 is an acute angle; meanwhile, the end portion 21b can extend beyond the cushion layer structure 23 to form a step, so that there is a certain distance between the edge of the end portion 21b and a surface of second sub-portion 22 close to the end portion 21b, thereby separating the light-emitting functional layer 32 by a gap between the edge of the end portion 21b and the second sub-portion 22.

Figure 6:
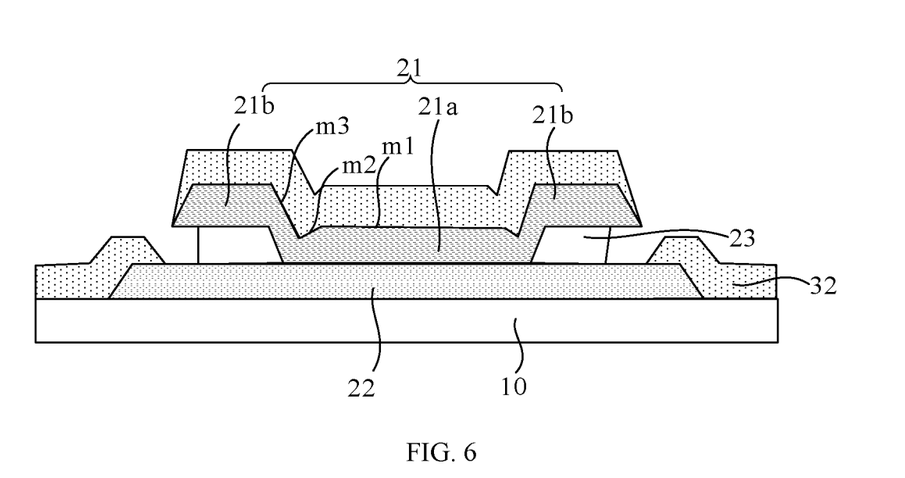
FIG. 6 is a partial schematic diagram of a display panel according to another embodiment of the present disclosure.

FIG. 6 is a partial schematic diagram of a display panel according to another embodiment of the present disclosure. As shown in FIG. 6, the cushion layer structure 23 includes an inorganic material. Since the layer made of an inorganic material is thin, when the cushion material layer 023 made of the inorganic material is etched to form the aperture V, the sidewall of the aperture V has a relatively steep slope. A location of the aperture V can refer to FIG. 4, and is not marked in FIG. 6. In an embodiment of the present disclosure, the first sub-portion 21 is deposited in the aperture V and extends to the outside of the aperture V to form a structure as shown in FIG. 6. The middle part 21a is located in the aperture V. A part of the end part 21b is in contact with a bevel surface (or sidewall) of the cushion layer structure 23, and another part of the end part 21b is in contact with a surface of the cushion layer structure 23 away from the substrate 10. With such a configuration, a certain large distance is formed between the edges of the two end portions 21a of the first sub-portion 21 and a surface of the second sub-portion 22, so that a gap is formed to separate the light-emitting functional layer 32. It can be understood that in this embodiment of the present disclosure, a part in direct contact with the second sub-portion 22 is the middle part 21a, and a part in direct contact with the cushion layer structure 23 is the end part 21b.

In addition, as shown in FIG. 6, a surface of the first sub-portion 21 away from the substrate 10 includes a flat plane portion m1, a first bevel portion m2 and a second bevel portion m3 that are connected to one another. The second bevel portion m3 is in contact with the first bevel portion m2. The flat plane portion m1 is located in a different horizontal plane from the first bevel portion m2. The first bevel portion m2 is located in a different horizontal plane from the second bevel portion m3. The first bevel portion m2 and the second bevel portion m3 define or otherwise form a gap therebetween. At least a part of the flat plane portion m1 and the first bevel portion m2 belong to a surface of the middle portion 21a away from the substrate 10. In an embodiment shown in FIG. 6, the second bevel portion m3 can be regarded as a part of the surface of the end portion 21b. When forming the first sub-portion 21, a part of the first sub-portion 21 is deposited in the aperture of the cushion material layer 023 and extends beyond the aperture along the sidewall of the aperture. When the first sub-portion 21 is formed into a film, the first part 21 located in the aperture has relatively uniform thickness, while the first part 21 located at a junction of a bottom surface of the aperture and the sidewall of the aperture is relatively thin, so that a "v"-like surface is formed locally at the first sub-portion 21. That is, the first bevel surface portion m2 is located in a different horizontal plane as the second bevel surface portion m3, and a "v"-like gap is formed between the first bevel surface portion m2 and the second bevel surface portion m3, and the first bezel portion m2 is connected to the flat plane portion m1.

In some other embodiments, an inorganic material layer and an organic material layer are located between a layer where the first sub-portion 21 is located and a layer where the second sub-portion 22 is located. On this case, one cushion layer structure 23 includes an inorganic material and an organic material simultaneously.

Figure 7:
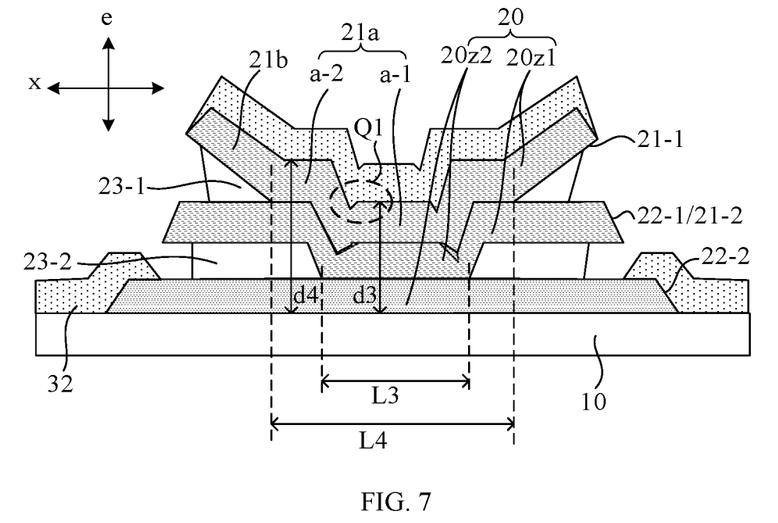
FIG. 7 is a partial schematic diagram of a display panel according to another embodiment of the present disclosure.

In some embodiments, the isolating pillar 20 includes at least two isolating groups stacked in a direction perpendicular to a plane of the substrate 10. Two adjacent isolating groups share one sub-portion. FIG. 7 is a partial schematic diagram of a display panel according to another embodiment of the present disclosure. As shown in FIG. 7, the isolating pillar 20 includes a first isolating group 20z1 and a second isolating group 20z2 that are adjacent to each other. The first isolating group 20z1 is located on a side of the second isolating group 20z2 away from the substrate 10. The first isolating group 20z1 includes a first sub-portion 21-1 and a second sub-portion 22-1. The second isolating group 20z2 includes a first sub-portion 21-2 and a second sub-portion 22-2. The second sub-portion 22-1 of the first isolating group 20z1 is reused as the first sub-portion 21-2 of the second isolating group 20z2. In an embodiment of the present disclosure, the isolating pillar 20 includes at least two isolating groups, and for each isolating group, a certain distance can be formed between the edge of the first sub-portion 21 and the second sub-portion 22 to form a gap, so that there is a greater distance between the edge of the first sub-portion 21 farthest from the substrate 10 and the second sub-portion 22 closest to the substrate 10 of the isolating pillar 20. A greater gap formed by such a greater distance has a stronger capability for separating the light-emitting function layer 32.

In an embodiment, the cushion layer structure 23-1 filled between the end portion of the first sub-portion 21-1 and the second sub-portion 22-1 of the first isolating group 20z1 includes an organic material. The cushion layer structure 23-2 filled between the end portion of the first sub-portion 21-2 and the second sub-portion 22-2 of the second isolating group 20z2 includes an inorganic material.

In some embodiments, as shown in FIG. 7, for the first isolating group 20z1, the middle portion 21a of the first sub-portion 21-1 includes a first sub-portion a-1 and a second sub-portion a-2, and the second sub-portion a-2 is connected to the end portion 21b and the first sub-portion a-1. In a direction e perpendicular to a plane of the substrate 10, a maximum distance between a surface of the first sub-portion a-1 away from the substrate 10 and the substrate 10 is a defined as a third distance d3, a maximum distance between a surface of the second sub-portion a-2 away from the substrate 10 and the substrate 10 is defined as a fourth distance d4. The third distance d3 is smaller than the fourth distance d4. That is, with the plane of the substrate 10 as a reference, a deposition position of the first sub-portion a-1 is lower than a deposition position of the second sub-portion a-2.

In an embodiment of the present disclosure, the first sub-portion 21-1 of the first isolating group 20z1 is equivalent to being connected to the second sub-portion 22-1 via a through-hole formed at the cushion layer structure 23-1, and the first sub-portion 21-2 of the second isolating group 20z2 is equivalent to being connected to the second sub-portion 22-2 via a through-hole formed at the cushion layer structure 23-2. A dimension of the aperture formed at the cushion layer structure 23-1 is set to be larger than a dimension of the aperture formed at the cushion layer structure 23-2. As can be seen from FIG. 7, compared with the bottom of the aperture, in the first direction x, the length L4 of the aperture formed at the cushion layer structure 23-1 is greater than the length L3 of the aperture formed at the cushion layer structure 23-2.

During the forming process, the second isolating group 20z2 is first formed, and a part of the first sub-portion 21-2 of the second isolating group 20z2 is deposited in the aperture of the cushion layer structure 23-2. The first sub-portion 21-2 of the second isolating group 20z2 can be reused as the second sub-portion 22-1 of the first isolating group 20z1. Since a part of the second sub-portion 22-1 is deposited in an aperture of a cushion layer structure, the second sub-portion 22-1 is not a flat structure. It can also be seen from FIG. 7 that the second sub-portion 22-1 is formed with a groove, then the first sub-portion 21-1 formed subsequently is deposited in the groove formed by the second sub-portion 22-1 and extends outward. That is, for the first isolating group 20z1, a bottom of the aperture of the cushion layer structure 23-1 is not a flat surface, so that a deposition position of the first sub-portion a-1 is lower than a disposition position of the second sub-portion a-2.

As indicated by the region Q1 shown in FIG. 7, a part of a surface of the first subdivision 21-1 of the first isolating group 20z1 away from the substrate 10 is a "v"-like surface, and a reason for the formation thereof is same as that of the embodiment shown in FIG. 6. The first sub-portion 21-2 of the second isolating group 20z2 also has a similar surface. In the first sub-portion 21-1, the flat surface portion m1, the first bevel portion m2, and the second bevel portion m3 that form a "v"-like surface belong to the middle portion 21a.

In some embodiments, each of the first sub-portion 21 and the second sub-portion 22 is made of a material including metal. The middle portion 21a of the first sub-portion 21 is in contact with the second sub-portion 22, so that the isolating pillar 20 can be an electrically conductive structure. The isolating pillar 20 can be connected to other structures to form an electrostatic discharge path to conduct the static electricity in each layer structure away. For example, the second electrode 33 in the light-emitting device layer 30 extends from the display region AA to the first non-display region BA1, and the second electrode 33 located in the first non-display region BA1 covers the isolating pillar 20, so that an electrostatic discharge path is formed in the first non-display region BA1. In addition, the display panel includes multiple metal layers, such as metal layers used to form metal structures in pixel circuits, and metal layers of electrodes of light-emitting devices. In an embodiment of the present disclosure, the first sub-portion and the second sub-portion can be formed by reusing the metal layers existing in the display panel without adding new processes, thereby simplifying the process.

Figure 8:
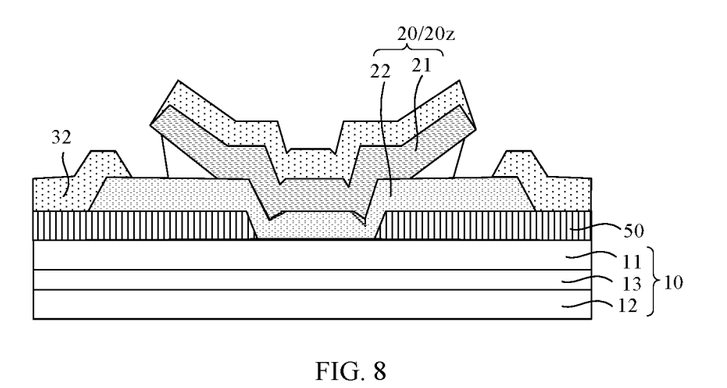
FIG. 8 is a partial schematic diagram of a display panel according to another embodiment of the present disclosure.

FIG. 8 is a partial schematic diagram of a display panel according to another embodiment of the present disclosure. FIG. 8 merely illustrates a part of the structure in the first non-display region BA1. As shown in FIG. 8, the display panel further includes a buffer layer 50. In the first non-display region BA1: the buffer layer 50 is located on a side of the isolating pillar 20 close to the substrate 10. The buffer layer includes a first aperture V1. At least a part of the second sub-portion 22 is in contact with the substrate 10 in the first aperture V1. FIG. 8 illustrates that the isolating pillar 20 includes one isolating group 20z. In addition, in the display region AA, the buffer layer 50 is located on a side of the pixel circuit layer 40 close to the substrate 10. The buffer layer 50 is made of an inorganic material. In an embodiment, the isolating pillar 20 is set to be in contact with the substrate 10. If each of the first sub-portion 21 and the second sub-portion 22 of the isolating pillar 20 is made of a material including metal, the isolating pillar 20 can be used to conduct the accumulated static electricity on the substrate 10 away, thereby preventing the static electricity from accumulating on the substrate 10 to adversely affect the operation of the pixel circuit of the pixel circuit layer 40.

In some embodiments, as shown in FIG. 8, the substrate 10 includes a first base layer 11, a second base layer 12, and a blocking layer 13 provided between the first base layer 11 and the second base layer 12. In an embodiment, the first base layer 11 and the second base layer 12 are made of a same material. In an embodiment, the first base layer 11 and the second base layer 12 each include a polyimide material.

Figure 9:
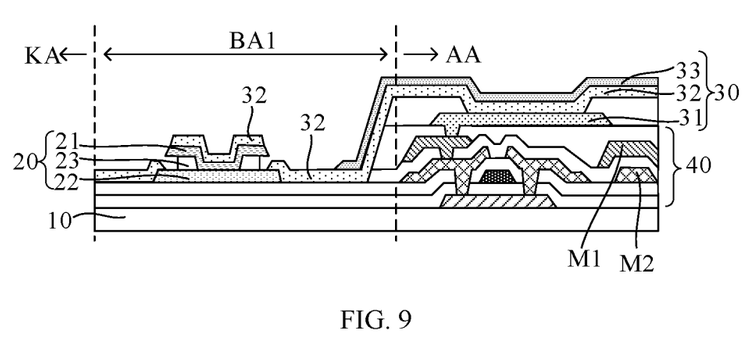
FIG. 9 is a cross-sectional view along A-A' shown in FIG. 1 according to another embodiment of the present disclosure.

FIG. 9 is a cross-sectional view along A-A' shown in FIG. 1 according to another embodiment of the present disclosure. As shown in FIG. 9, in the display region AA, the pixel circuit layer 40 includes a first metal structure M1 and a second metal structure M2. The first metal structure M1 is located on a side of the second metal structure M2 away from the substrate 10. The first sub-portion 21 and the first metal structure M1 are located in a same layer. The second sub-portion 22 and the second metal structure M2 are located in a same layer. That is, the first sub-portion 21 and the first metal structure M1 are formed in a same process, and the second sub-portion 22 and the second metal structure M2 are formed in a same process. The isolating pillar 20 is formed by reusing the original process for the display panel, thereby simplifying the process.

In some embodiments, the pixel circuit layer 40 includes a semiconductor layer, and a first metal layer, a second metal layer, a third metal layer, and a fourth metal layer that are sequentially arranged at a side of the semiconductor layer away from the substrate 10. The metal structures in the pixel circuit layer 40 are respectively arranged in four metal layers. The metal structures in the pixel circuit layer 40 at least include a scan line, a data line, a power voltage line, a reset signal line, a storage capacitor and other structures.

In some embodiments, the first metal layer and the second metal layer are made of a same material, and the third metal layer and the fourth metal layer are made of a same material. In an embodiment, the first metal layer and the second metal layer are made of a material including molybdenum. The third metal layer and the fourth metal layer are made of a material including titanium and/or aluminum.

In an embodiment of the present disclosure, the scan line and a first electrode plate of the storage capacitor are located in the first metal layer, a second electrode plate of the storage capacitor and the reset signal line are located in the second metal layer, and the data line and the power voltage line are located in the third metal layer. The display panel further includes an auxiliary power line located in the fourth metal layer. The auxiliary power line is coupled to the power voltage line located in the third metal layer. The auxiliary power line is configured to reduce a voltage drop on the power voltage line.

In some embodiments, the first sub-portion 21 and the second sub-portion 22 are made of a same material. The first metal structure M1 shown in FIG. 9 is an auxiliary power line located in the fourth metal layer, and the second metal structure M2 shown in FIG. 9 is a power voltage line located in the third metal layer. That is, the first sub-portion 21 is located in the fourth metal layer in the pixel circuit layer 40, and the second sub-portion 22 is located in the third metal layer.

In at least one isolating group, the first sub-portion 21 includes a metal titanium layer, a metal aluminum layer and a metal titanium layer that are stacked. The first sub-portion 21 is a structure with three layers of titanium, aluminum and titanium. In an embodiment, the first sub-portion 21 is relatively thick, so that a gap formed between the edge of the end portion of the first sub-portion 21 and the second sub-portion 22 is relatively large, thereby achieving a stronger capability for separating the light-emitting functional layer 32 by the isolating pillar 20.

In some embodiments, the first sub-portion 21 and the second sub-portion 22 each include a metal titanium layer, a metal aluminum layer and a metal titanium layer that are stacked.

In another embodiment, the pixel circuit layer 40 includes a first metal layer, a second metal layer, a third metal layer and a fourth metal layer that are sequentially arranged along a direction away from the substrate 10. The first metal structure M1 is located in the fourth metal layer. The second metal structure M2 is located in the second metal layer or the first metal layer.

In another embodiment, the pixel circuit layer 40 includes a first metal layer, a second metal layer, a third metal layer and a fourth metal layer that are sequentially arranged along a direction away from the substrate 10. The first metal structure M1 is located in the third metal layer. The second metal structure M2 is located in the second metal layer or the first metal layer.

In another embodiment, the pixel circuit layer 40 includes a first metal layer, a second metal layer, a third metal layer and a fourth metal layer that are sequentially arranged along a direction away from the substrate 10. The first metal structure M1 is located in the second metal layer. The second metal structure M2 is located in the first metal layer.

Figure 10:
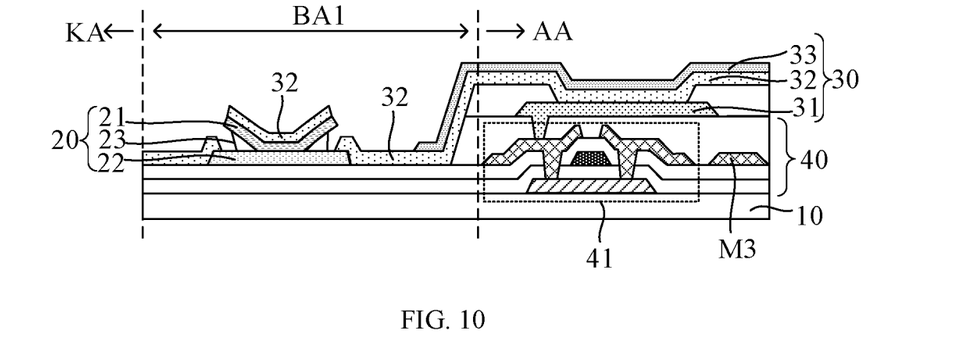
FIG. 10 is a cross-sectional view along A-A' shown in FIG. 1 according to another embodiment of the present disclosure.

FIG. 10 is a cross-sectional view along A-A' shown in FIG. 1 according to another embodiment of the present disclosure. As shown in FIG. 10, the light-emitting device layer 30 further includes a first electrode 31. The first electrode 31 is located on a side of the light-emitting functional layer 32 close to the substrate 10. The pixel circuit layer 40 includes a third metal structure M3. The sub-portion 21 and the first electrode 31 are located in a same layer. The second sub-portion 22 and the third metal structure M3 are located in a same layer. That is, the first sub-portion 21 and the first electrode 31 are formed in a same process, and the second sub-portion 22 and the third metal structure M3 are formed in a same process. The isolating pillar 20 is formed by reusing the original process for the display panel, thereby simplifying the process.

In some embodiments, the pixel circuit layer 40 includes a semiconductor layer, and a first metal layer, a second metal layer, and a third metal layer that are located on the semiconductor layer and sequentially arranged along a direction away from the substrate 10. The metal structures in the pixel circuit layer 40 are arranged on the three metal layers, respectively. The metal structures in the pixel circuit layer 40 at least include a scan line, a data line, a power voltage line, a reset signal line, a storage capacitor and other structures.

In an embodiment, the scan line and a first electrode plate of the storage capacitor are located in the first metal layer, the reset signal line and a second electrode plate of the storage capacitor are located in the second metal layer, and the data line and the power voltage line are located in the third metal layer. The third metal structure M4 shown in FIG. 10 is a data line. That is, the second sub-portion 22 is located in the third metal layer.

In another embodiment, the pixel circuit layer 40 includes a first metal layer, a second metal layer, a third metal layer and a fourth metal layer that are sequentially arranged along a direction away from the substrate 10. The first sub-portion 21 and the first electrode 31 in the light-emitting device layer 30 are located in a same layer. The second sub-portion 22 is located in the second metal layer or the first metal layer.

In another embodiment, the pixel circuit layer 40 includes a first metal layer, a second metal layer, a third metal layer and a fourth metal layer that are sequentially arranged along a direction away from the substrate 10. The first sub-portion 21 is located in the third metal layer. The second sub-portion 22 is located in the second metal layer or the first metal layer.

Figure 11:
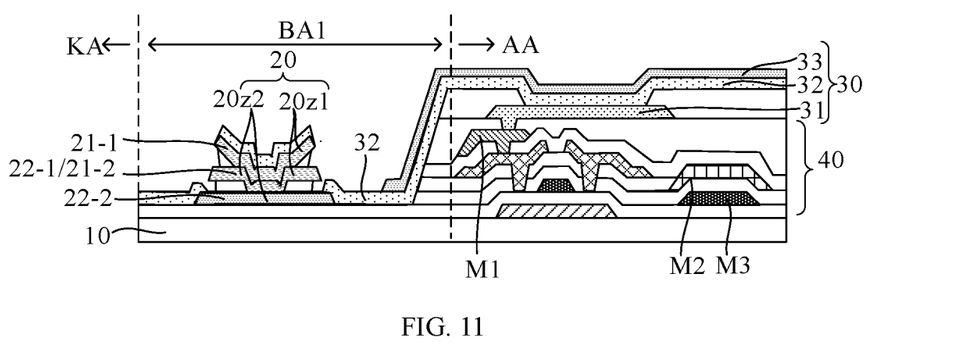
FIG. 11 is a cross-sectional view along A-A' shown in FIG. 1 according to another embodiment of the present disclosure.

FIG. 11 is a cross-sectional view along A-A' shown in FIG. 1 according to another embodiment of the present disclosure. As shown in FIG. 11, the pixel circuit layer 40 includes a first metal structure M1, a second metal structure M2 and a third metal structure M3 that are sequentially arranged along a direction close to the substrate 10. The first sub-portion 21-1 of the first isolating group 20$z$1 and the second metal structure M2 are located in a same layer. The second sub-portion 22-1 of the first isolating group 20$z$1 and the second metal structure M2 are located in a same layer. The second sub-portion 22-1 of the first isolating group 20$z$1 is reused as the first sub-portion 21-2 of the second isolating group 20$z$2. The second sub-portion 22-2 of the second isolating group 20$z$2 and the third metal structure M3 are located in a same layer. The first metal structure M1 is a connection electrode located in the fourth metal layer. The connection electrode is configured to realize the connection between the pixel circuit and the first electrode 31. The second metal structure M2 is the second electrode plate of the storage capacitor. The third metal structure M3 is the first electrode plate of the storage capacitor. In the embodiment shown in FIG. 11, it can be seen that the second metal structure M2 overlaps with the third metal structure M3.

In the embodiments in which the pixel circuit layer 40 includes four metal layers, the first sub-portion 21-1 of the first isolating group 20$z$1 is located in the fourth metal layer, the second sub-portion 22-1 of the first isolating group 20$z$1 is located in the third metal layer, and the second sub-portion 22-2 of the second isolating group 20$z$2 is located in the second metal layer.

In another embodiment, the pixel circuit layer 40 includes four metal layers. The first sub-portion 21-1 of the first isolating group 20$z$1 is located in the fourth metal layer. The second sub-portion 22-1 of the first isolating group 20$z$1 is located in the third metal layer. The second sub-portion 22-2 of the second isolating group 20$z$2 is located in the first metal layer.

In another embodiment, the pixel circuit layer 40 includes four metal layers. The first sub-portion 21-1 of the first isolating group 20$z$1 is located in the third metal layer. The second sub-portion 22-1 of the first isolating group 20$z$1 is located in the second metal layer. The second sub-portion 22-2 of the second isolating group 20$z$2 is located in the first metal layer.

In some embodiments, the pixel circuit layer 40 includes three metal layers. The first sub-portion 21-1 of the first isolating group 20$z$1 is located in the third metal layer. The second sub-portion 22-1 of the first isolating group 20$z$1 is located in the second metal layer. The second sub-portion 22-2 of the second isolating group 20$z$2 is located in the first metal layer.

Figure 12:
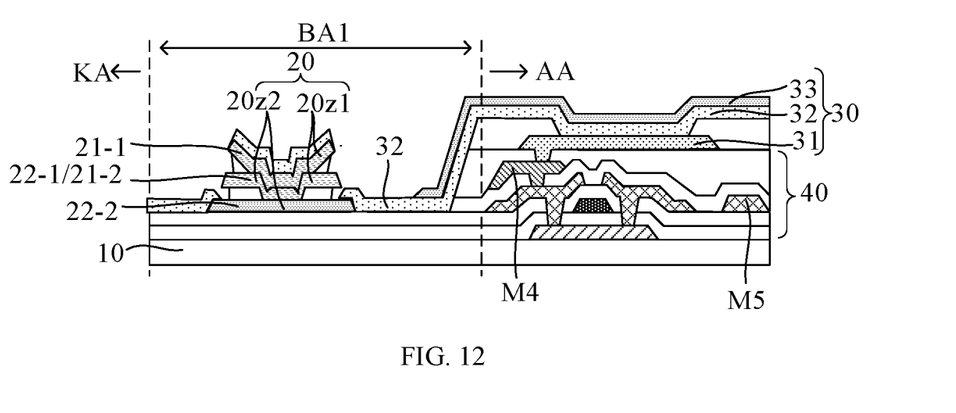
FIG. 12 is a cross-sectional view along A-A' shown in FIG. 1 according to another embodiment of the present disclosure.

FIG. 12 is a cross-sectional view along A-A' shown in FIG. 1 according to another embodiment of the present disclosure. As shown in FIG. 12, the display panel includes a pixel circuit layer 40 and a light-emitting device layer 30. The pixel circuit layer 40 includes a fourth metal structure M4 and a fifth metal structure M5 that are sequentially arranged along a direction close to the substrate 10. The first sub-portion 21-1 of the first isolating group 20$z$1 and the first electrode are located in a same layer. The second sub-portion 22-1 of the first isolating group 20$z$1 and the fourth metal structure M4 are located in a same layer. The second sub-portion 22-2 of the second isolating group 20$z$2 and the fifth metal structure M5 are located in a same layer.

In an embodiment shown in FIG. 12, the pixel circuit layer 40 includes four metal layers. The fourth metal structure M4 is a connection electrode located in the fourth metal layer, and the fifth metal structure M5 is a data line. That is, the first sub-portion 21-1 of the first isolating group 20$z$1 and the first electrode are located in a same layer. The second sub-portion 22-1 of the first isolating group 20$z$1 is located in the fourth metal layer. The second portion 22-2 of the second isolating group 20$z$2 is located in the third metal layer.

In another embodiment, the pixel circuit layer 40 includes four metal layers. The first sub-portion 21-1 of the first isolating group 20z1 and the first electrode are located in a same layer. The second sub-portion 22 of the first isolating group 20z1 and the second sub-portion 22-2 of the second isolating group 20z2 are located in two of the four metal layers, respectively.

In another embodiment, the isolating pillar 20 includes three isolating groups that are stacked. Two adjacent isolating groups share one sub-portion.

Figure 13:
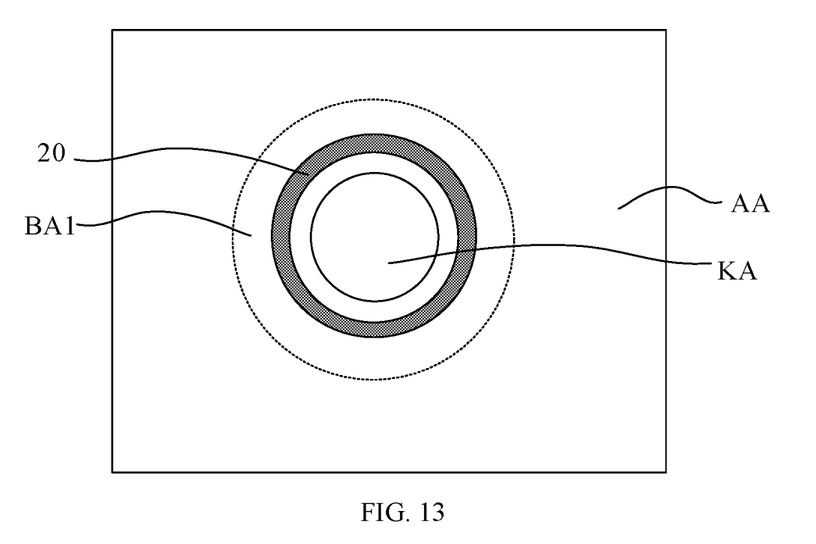
FIG. 13 is a partial top view of a display panel according to another embodiment of the present disclosure.

FIG. 13 is a partial top view of a display panel according to another embodiment of the present disclosure. As shown in FIG. 13, the isolating pillar 20 surrounds the through-hole region KA. As shown in FIG. 13, one isolating pillar 20 is provided in the first non-display region BA1. In some embodiments, two or more isolating pillars 20 are provided in the first non-display region BA1. Each isolating pillar 20 surrounds the through-hole region KA.

Figure 14:
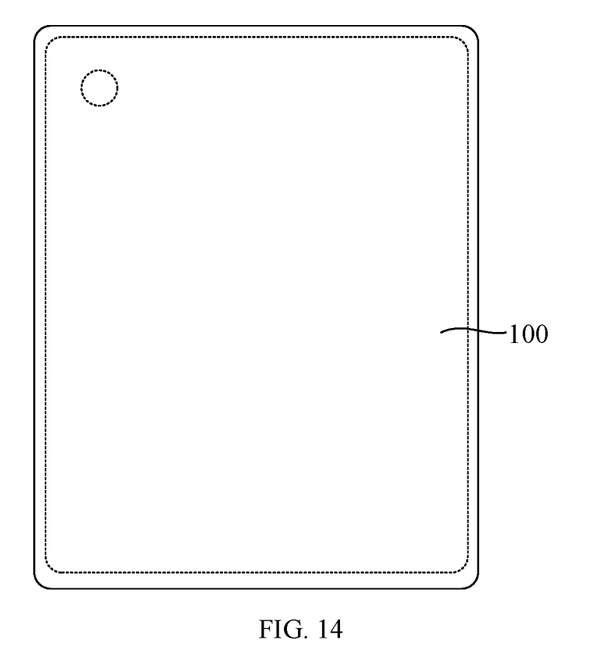
FIG. 14 is a schematic diagram of a display device according to an embodiment of the present disclosure.

Based on a same inventive concept, the present disclosure further provides a display device. FIG. 14 is a schematic diagram of a display device according to an embodiment of the present disclosure. As shown in FIG. 14, the display device includes the display panel 100 provided by any embodiment of the present disclosure. The structure of the display panel 100 has been described in the above related embodiments, and will not be elaborated herein. The electronic device in the embodiments of the present disclosure can be a mobile phone, a tablet computer, a notebook computer, a smart wearable device, or the like.

The above are merely some embodiments of the present disclosure, which, as mentioned above, are not used to limit the present disclosure. Whatever within the principles of the present disclosure, including any modification, equivalent substitution, improvement, etc., shall fall into the protection scope of the present disclosure.

Finally, it should be noted that the technical solutions of the present disclosure are illustrated by the above embodiments, but not intended to limit thereto. Although the present disclosure has been described in detail with reference to the foregoing embodiments, those skilled in the art can understand that the present disclosure is not limited to the specific embodiments described herein, and can make various obvious modifications, readjustments, and substitutions without departing from the scope of the present disclosure.

What is claimed is:

1. A display panel, comprising:
a substrate;
an isolating pillar; and
a light-emitting functional layer,
wherein the display panel has a display region, a first non-display region, and a through-hole region, the display region at least partially surrounds the through-hole region, and the first non-display region is located between the display region and the through-hole region,
wherein the isolating pillar and the light-emitting functional layer are located on a same side of the substrate; the isolating pillar is located in the first non-display region, and the light-emitting functional layer extends from the display region to the first non-display region,
wherein the isolating pillar comprises at least one isolating group, and each isolating group of the at least one isolating group comprises a first sub-portion and a second sub-portion located at a side of the first sub-portion close to the substrate,
wherein the first sub-portion comprises a middle portion and two end portions, the middle portion is located between the two end portions in a first direction, the middle portion is in contact with the second sub-portion, and the two end portions are connected to the middle portion,
wherein a cushion layer structure is disposed between the second sub-portion and each of the two end portions, and an edge of each of the two end portions extends beyond the cushion layer structure in the first direction to form a respective step,
wherein the light-emitting functional layer is located at a side of the isolating pillar away from the substrate, and is cut off at a position of the edge of each of the two end portions away from the middle portion, and
wherein the display panel further comprises:
a buffer layer; and
a pixel circuit layer,
wherein, in the display region, the buffer layer is located at a side of the pixel circuit layer adjacent to the substrate; and
wherein, in the first non-display region, the buffer layer is located on a side of the isolating pillar adjacent to the substrate and comprises a first aperture, and at least part of the second sub-portion is in contact with the substrate in the first aperture.

2. The display panel according to claim 1, wherein the middle portion and the two end portions of the first sub-portion are composed of a same material.

3. The display panel according to claim 1, wherein, for the at least one isolating group, an orthographic projection of the first sub-portion onto the substrate is located within an orthographic projection of the second sub-portion onto the substrate.

4. The display panel according to claim 1, wherein the first sub-portion and the second sub-portion are composed of a same material.

5. The display panel according to claim 1, wherein,
for the at least one isolating group, the first sub-portion comprises a first metal titanium layer, a metal aluminum layer, and a second metal titanium layer, wherein the first metal titanium layer, the metal aluminum layer, and the second metal titanium layer are stacked.

6. The display panel according to claim 1, wherein,
the cushion layer structure comprises at least one of an organic material or an inorganic material.

7. The display panel according to claim 1, wherein the cushion layer structure comprises a first surface, a second surface, and a third surface; the first surface is in contact with the two end portions, the second surface is in contact with the second sub-portion, and the third surface is connected between the first surface and the second surface; and an angle formed between the third surface and a surface of the second sub-portion and located outside the cushion layer structure is an acute angle.

8. The display panel according to claim 1, wherein, for the first sub-portion, in a direction perpendicular to a plane of the substrate, a maximum distance between a surface of the middle portion away from the substrate and the substrate is defined as a first distance, and a maximum distance between a surface of each of the twos end portions away from the substrate and the substrate is defined as a second distance, wherein the second distance is greater than the first distance.

9. The display panel according to claim 1, wherein a surface of the first sub-portion away from the substrate comprises a flat plane portion, a first bevel portion, and a second bevel portion that are connected in sequence; the flat plane portion and the first bevel portion are located in different horizontal planes, the first bevel portion and the second bevel portion are located in different horizontal planes, and the first bevel portion and the second bevel portion define a gap therebetween; and at least the flat surface portion and the first bevel portion belong to a surface of the middle portion away from the substrate.

10. The display panel according to claim 1, wherein the middle portion comprises a first sub-portion and a second sub-portion, the second sub-portion is connected to each of the two end portions and the first sub-portion; and wherein, in a direction perpendicular to a plane of the substrate, a maximum distance between a surface of the first sub-portion away from the substrate and the substrate is defined as a third distance, and a maximum distance between a surface of the second sub-portion away from the substrate and the substrate is defined as a fourth distance, wherein the third distance is smaller than the fourth distance.

11. The display panel according to claim 1, wherein, in one isolating group of the at least one isolating group, each of the two end portions is opposite to the second sub-portion, and an angle formed between a surface of one of the two end portions and a surface of the second sub-portion that are opposite to each other and are not in contact with each other is an acute angle.

12. The display panel according to claim 1, further comprising a pixel circuit layer, wherein the isolating pillar comprises an isolating group of the at least one isolating group;

wherein the pixel circuit layer comprises a first metal structure and a second metal structure, and the first metal structure is located at a side of the second metal structure away from the substrate; and wherein the first sub-portion and the first metal structure are located in a same layer, and the second sub-portion and the second metal structure are located in a same layer.

13. The display panel according to claim 1, further comprising:

a pixel circuit layer; and
a light-emitting device layer,
wherein the isolating pillar comprises an isolating group of the at least one isolating group;
wherein the light-emitting device layer is located at a side of the pixel circuit layer away from the substrate;
wherein the light-emitting device layer comprises the light-emitting functional layer, and a first electrode located on a side of the light-emitting functional layer adjacent to the substrate;
wherein the pixel circuit layer comprises a third metal structure; and
wherein the first sub-portion and the first electrode are located in a same layer, and the second sub-portion and the third metal structure are located in a same layer.

14. A display panel, comprising:

a substrate;
an isolating pillar; and
a light-emitting functional layer,
wherein the display panel has a display region, a first non-display region, and a through-hole region, the display region at least partially surrounds the through-hole region, and the first non-display region is located between the display region and the through-hole region,
wherein the isolating pillar and the light-emitting functional layer are located on a same side of the substrate; the isolating pillar is located in the first non-display region, and the light-emitting functional layer extends from the display region to the first non-display region, wherein the isolating pillar comprises at least one isolating group, and each isolating group of the at least one isolating group comprises a first sub-portion and a second sub-portion located at a side of the first sub-portion close to the substrate, wherein the first sub-portion comprises a middle portion and two end portions, the middle portion is located between the two end portions in a first direction, the middle portion is in contact with the second sub-portion, and the two end portions are connected to the middle portion, wherein a cushion layer structure is disposed between the second sub-portion and each of the two end portions, and an edge of each of the two end portions extends beyond the cushion layer structure in the first direction to form a respective step, wherein the light-emitting functional layer is located at a side of the isolating pillar away from the substrate, and is cut off at a position of the edge of each of the two end portions away from the middle portion, and wherein the isolating pillar comprises at least two isolating groups stacked on a plane perpendicular to the substrate, and two adjacent isolating groups of the at least two isolating groups share one of the first sub-portion and the second sub-portion; and wherein the at least two isolating groups comprise a first isolating group and a second isolating group that are adjacent to each other, the first isolating group is located on a side of the second isolating group away from the substrate, and the second sub-portion of the first isolating group is reused as the first sub-portion of the second isolating group.

15. The display panel according to claim 14, further comprising a pixel circuit layer, wherein the pixel circuit layer comprises a first metal structure, a second metal structure and a third metal structure that are sequentially arranged along a direction close to the substrate; and wherein the first sub-portion of the first isolating group and the first metal structure are located in a same layer, the second sub-portion of the first isolating group and the second metal structure are located in a same layer, and the second sub-portion of the second isolating group and the third metal structure are located in a same layer.

16. The display panel according to claim 14, further comprising a pixel circuit layer and a light-emitting device layer, wherein the light-emitting device layer is located on a side of the pixel circuit layer away from the substrate;

wherein the light-emitting device layer comprises the light-emitting functional layer and a first electrode located on a side of the light-emitting functional layer adjacent to the substrate;
wherein the pixel circuit layer comprises a fourth metal structure and a fifth metal structure that are sequentially arranged along a direction adjacent to the substrate; and
wherein the first sub-portion of the first isolating group and the first electrode are located in a same layer, the second sub-portion of the first isolating group and the fourth metal structure are located in a same layer, and the second sub-portion of the second isolating group and the fifth metal structure are located in a same layer.

17. A display device, comprising a display panel comprising:

a substrate;
an isolating pillar; and a light-emitting functional layer, wherein the display panel comprises a display region, a first non-display region, and a through-hole region, the display region at least partially surrounds the through-hole region, and the first non-display region is located between the display region and the through-hole region, wherein the isolating pillar and the light-emitting functional layer are located on a same side of the substrate; the isolating pillar is located in the first non-display region, and the light-emitting functional layer extends from the display region to the first non-display region, wherein the isolating pillar comprises at least one isolating group, and each isolating group of the at least one isolating group comprises a first sub-portion, and a second sub-portion located at a side of the first sub-portion close to the substrate, wherein the first sub-portion comprises a middle portion and two end portions, the middle portion is located between the two end portions in a first direction, the middle portion is in contact with the second sub-portion, and the two end portions are connected to the middle portion, wherein a cushion layer structure is disposed between the second sub-portion and each of the two end portions, and an edge of each of the two end portions extends beyond the cushion layer structure in the first direction to form a respective step;

wherein the light-emitting functional layer is located at a side of the isolating pillar away from the substrate, and is cut off at a position of the edge of each of the two end portions away from the middle portion, and wherein the display panel further comprises:

a buffer layer; and a pixel circuit layer, wherein, in the display region, the buffer layer is located at a side of the pixel circuit layer adjacent to the substrate; and wherein, in the first non-display region, the buffer layer is located on a side of the isolating pillar adjacent to the substrate and comprises a first aperture, and at least part of the second sub-portion is in contact with the substrate in the first aperture.

* * * * *